(12) United States Patent
Hsu et al.

(10) Patent No.: US 11,081,435 B2
(45) Date of Patent: Aug. 3, 2021

(54) PACKAGE SUBSTRATE AND FLIP-CHIP PACKAGE CIRCUIT INCLUDING THE SAME

(71) Applicant: PHOENIX PIONEER TECHNOLOGY CO., LTD., Hsinchu County (TW)

(72) Inventors: Che-Wei Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 267 days.

(21) Appl. No.: 15/860,817

(22) Filed: Jan. 3, 2018

(65) Prior Publication Data

US 2018/0122734 A1 May 3, 2018

Related U.S. Application Data

(62) Division of application No. 14/520,767, filed on Oct. 22, 2014, now Pat. No. 9,893,003.

(30) Foreign Application Priority Data

Jun. 17, 2014 (TW) .................................. 103120892

(51) Int. Cl.
*H01L 23/498* (2006.01)
*H01L 21/48* (2006.01)

(52) U.S. Cl.
CPC .... *H01L 23/49822* (2013.01); *H01L 21/4857* (2013.01); *H01L 23/49816* (2013.01); *H01L 23/49827* (2013.01); *H01L 2224/16225* (2013.01); *H01L 2924/181* (2013.01); *Y10T 29/49156* (2015.01)

(58) Field of Classification Search
CPC ......... H01L 23/49822; H01L 23/49816; H01L 23/49827; H01L 21/4857; H01L 2224/16225; H01L 2924/181; Y10T 29/49156
USPC ............................. 29/846, 829, 825, 592.1
See application file for complete search history.

(56) References Cited

U.S. PATENT DOCUMENTS

| 7,906,850 B2 * | 3/2011 | Wang .................. H01L 24/24 257/774 |
| 8,809,951 B2 | 8/2014 | Lin et al. |
| 8,835,221 B2 | 9/2014 | Lee et al. |
| 8,927,412 B1 * | 1/2015 | Lin .................. H01L 24/97 438/613 |
| 2009/0206479 A1 | 8/2009 | Daubenspeck et al. |

(Continued)

*Primary Examiner* — Peter Dungba Vo
*Assistant Examiner* — Azm A Parvez
(74) *Attorney, Agent, or Firm* — WPAT, PC

(57) ABSTRACT

This disclosure provides a package substrate, a flip-chip package circuit, and their fabrication methods. The package substrate includes: a first wiring layer having a first dielectric material layer and a first metal wire protruding from the first dielectric material layer; a conductive pillar layer formed on the first wiring layer and including a molding compound layer, a second dielectric material layer formed on the molding compound layer, and a metal pillar connected to the first metal wire; a second wiring layer formed on the conductive pillar layer and including a second metal wire connected to the metal pillar; and a protection layer formed on the second wiring layer.

4 Claims, 5 Drawing Sheets

(56) References Cited

U.S. PATENT DOCUMENTS

| | | | |
|---|---|---|---|
| 2010/0139090 A1 | 6/2010 | Muramatsu et al. | |
| 2011/0042128 A1* | 2/2011 | Hsu | H05K 3/4007 174/257 |
| 2012/0313242 A1* | 12/2012 | Sakuma | H05K 1/0306 257/738 |
| 2013/0062761 A1 | 3/2013 | Lin et al. | |

* cited by examiner

PACKAGE SUBSTRATE AND FLIP-CHIP PACKAGE CIRCUIT INCLUDING THE SAME

This application claims the benefit of Taiwan application Serial No. 103120892, filed on Jun. 17, 2014, and the disclosure of which is incorporated by reference herein in its entirety.

TECHNICAL FIELD

The present disclosure relates to a package substrate, a flip-chip package circuit, and their fabrication methods.

TECHNICAL BACKGROUND

A next-generation electronic product is asked to have multiple functions and high-speed performance other than compactness. The integrated-circuit manufacturers have moved to smaller design rules to make chips with much more electronic devices. On the other hand, the techniques for packaging the chips or semiconductor substrates have also been developed for the same purpose.

Conventionally, a flip-chip chip size package (FCCSP) substrate 10 used to construct the so-called "molded interconnection substrate (MIS)" can be illustrated in FIG. 1. A photo-sensitive primer material can be used to form the dielectric material layer 17 on the molding compound layer 16, and the metal pillars 18 are used to connect the upper-layer conductive wires 14 and the lower-layer conductive wires 12. Wherein, bottom surfaces of the molding compound layer 16 and the lower-layer conductive wires 12 may be arranged in the same plane, or the molding compound layer 16 may have a bottom surface protruding from that of the lower-layer conductive wires 12 as shown in FIG. 1. Often, roughness and non-uniformity may happen on the bottom surfaces of the lower-layer conductive wires 12, and this fact would induce not-good soldering points during the soldering process and thus diminish the fabrication yield. Therefore, it is in need to develop a new means for fabricating package substrates.

TECHNICAL SUMMARY

According to one aspect of the present disclosure, one embodiment provides a package substrate, which includes: a first wiring layer having a first dielectric material layer and a first metal wire protruding from the first dielectric material layer; a conductive pillar layer formed on the first wiring layer and including a molding compound layer, a second dielectric material layer formed on the molding compound layer, and a metal pillar connected to the first metal wire; a second wiring layer formed on the conductive pillar layer and including a second metal wire connected to the metal pillar; and a protection layer formed on the second wiring layer.

According to one aspect of the present disclosure, one embodiment provides a flip-chip package circuit, which includes: a first wiring layer having a first dielectric material layer and a first metal wire protruding from the first dielectric material layer; a conductive pillar layer formed on the first wiring layer and including a molding compound layer, a second dielectric material layer formed on the molding compound layer, and a metal pillar connected to the first metal wire; a second wiring layer formed on the conductive pillar layer and including a second metal wire connected to the metal pillar; a protection layer formed on the second wiring layer and having an opening exposing the second metal wire; a circuit chip disposed under the first wiring layer and electrically connected to the first metal wire; and a printed circuit board disposed on the protection layer and electrically connected to the second metal wire through the opening of the protection layer.

According to another aspect of the present disclosure, another embodiment provides a method of fabricating a package substrate, which includes: (A) providing a carrier; (B) forming a first wiring layer on the carrier, wherein the first wiring layer includes a first metal wire and a first dielectric material layer filling the remaining part of the first wiring layer; (C) forming a conductive pillar layer on the first wiring layer, wherein the conductive pillar layer includes a molding compound layer, a second dielectric material layer formed on the molding compound layer, and a metal pillar connected to the first metal wire; (D) forming a second wiring layer including a second metal wire on the conductive pillar layer, so that the second metal wire is connected to the metal pillar; (E) forming a protection layer on the second wiring layer, and removing the carrier; and (F) removing a part of the first dielectric material layer, so that the first metal wire protrudes from the first dielectric material layer.

In one embodiment, the package substrate is a flip-chip chip size package (FCCSP) substrate.

In one embodiment, the first dielectric material layer has an protrusion part surrounding the first metal wire.

In one embodiment, the protrusion part extends from the first dielectric material layer downwards.

In one embodiment, the protrusion part has a decreasing width from top to bottom.

In one embodiment, the protrusion part has a concave side wall.

In one embodiment, the first metal wire has a side surface completely covered by the first dielectric material layer.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
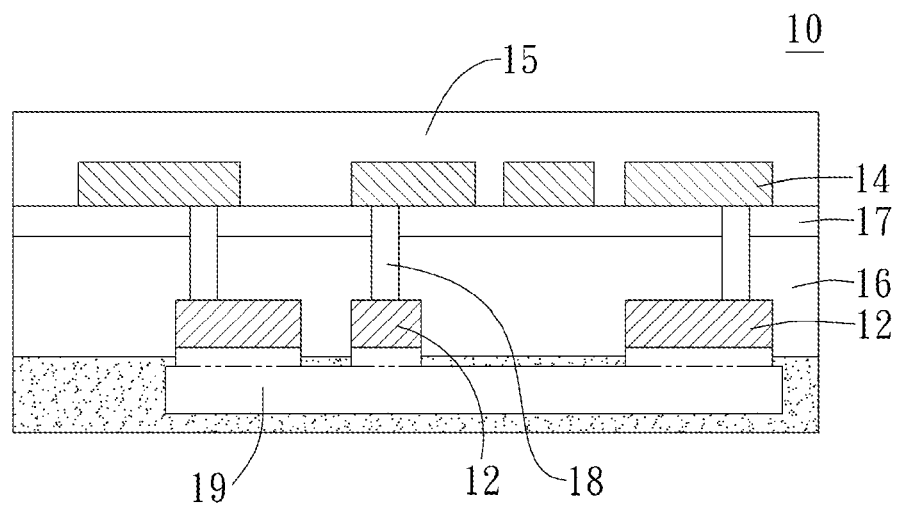
FIG. 1 is a cross-sectional view of a prior-art flip-chip chip size package (FCCSP) substrate.
Figure 2:
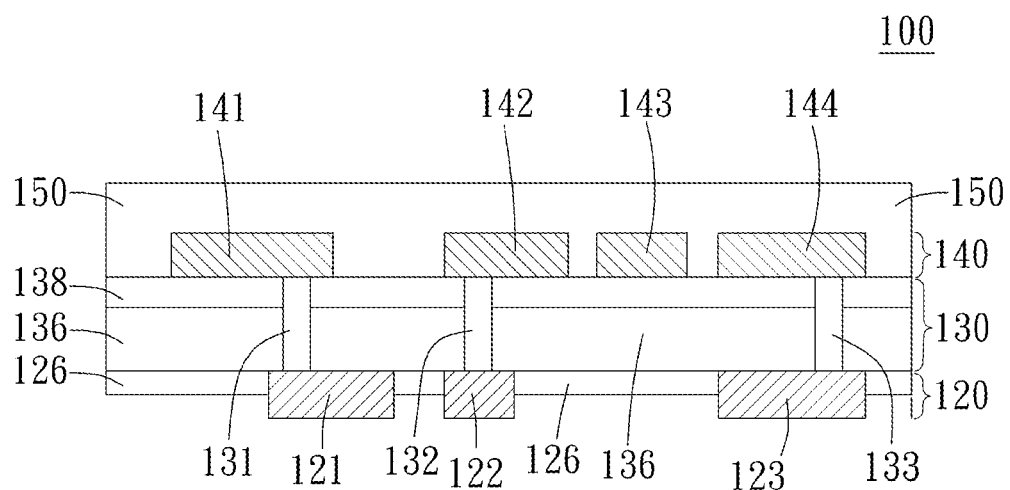
FIG. 2 schematically shows a cross-sectional view of a package substrate according to one embodiment of the present disclosure.

FIG. 2 schematically shows a cross-sectional view of a package substrate 100 according to one embodiment of the present disclosure. The package substrate 100 includes a first wiring layer 120, a conductive pillar layer 130, a second wiring layer 140, and a protection layer 150. The first wiring layer 120 includes a first dielectric material layer 126 and at least one first metal wire 121-123, wherein the first metal wires 121-123 are formed by patterning a metal layer acting as lower-layer conductive wires of the package substrate 100, and at least one of the first metal wires 121-123 may protrude from the first dielectric material layer 126. Assuming that originally the first wiring layer 120 has a constant thickness so that the first dielectric material layer 126 has a thickness equal to that of the first metal wire 121-123, we may then remove the lower part of the first dielectric material layer 126 to form the recesses as shown in FIG. 2. The projections, formed by protruding the first metal wires 121-123 from the first dielectric material layer 126, can be used to prevent not-good soldering points which may be formed during the soldering process when a circuit chip is bonded to the first wiring layer 120. One of the possible reasons comes from roughness and non-uniformity of the bottom surfaces of the first metal wires 121-123 when they are fabricated.

The conductive pillar layer 130 includes a molding compound layer 136, a second dielectric material layer 138, and at least one metal pillar 131-133, formed on the first wiring layer 120. Wherein, the metal pillars 131-133 are formed by patterning a metal layer and are used to connect the first wiring layer 120 and the second wiring layer 140. As shown in FIG. 2, the molding compound layer 136 is formed on the first wiring layer 120 and the second dielectric material layer 138 is directly formed on the molding compound layer 136. The metal pillar 131 connect the first metal wire 121 and the second metal wire 141, the metal pillar 132 connect the first metal wire 122 and the second metal wire 142, and the metal pillar 133 connect the first metal wire 123 and the second metal wire 144. None of the molding compound layer 136 and the second dielectric material layer 138 overlaps the metal pillars 131-133 vertically. The metal pillars 131-133 are included in the conductive pillar layer 130, and the molding compound layer 136 and the second dielectric material layer 138 together occupy the remaining part of the conductive pillar layer 130. Also, the molding compound layer 136 and the second dielectric material layer 138 respectively surround the lower and upper parts of the metal pillars 131-133. The molding compound layer 136 can be made of insulating material suitable for molding, such as epoxy-based-resin molding compound (EMC) and polyimide. Also, the second dielectric material layer 138 can be made of epoxy-based resin or polyimide. In one embodiment, the first dielectric material layer 126 may be made of a material which is used to form the molding compound layer 136; that is to say, the occupation area of the first dielectric material layer 126 in FIG. 2 can be filled with the composition material of the molding compound layer 136.

The second wiring layer 140, including at least one second metal wire 141-144, can be formed on the conductive pillar layer 130; wherein the second metal wires 141-144 are formed by patterning a metal layer acting as upper-layer conductive wires of the package substrate 100. The second metal wires 141, 142 and 144 are connected to the metal pillars 131, 132 and 133, respectively. In the embodiment, the metal pillars 131-133 can be made of copper, so as to electrically connect the second wiring layer 140 (the upper circuit layer) and the first wiring layer 120 (the lower circuit layer). Moreover, the protection layer 150 is formed of insulating material on the second wiring layer 140, to be the outermost part or the bottom of the package substrate 100. The protection layer 150 can be used to protect the package substrate 100 from being damaged by external objects or the subsequent fabrication process like soldering. The package substrate 100 can be a flip-chip chip size package (FCCSP) substrate used to construct the so-called "molded interconnection substrate (MIS)".

Figure 3A:
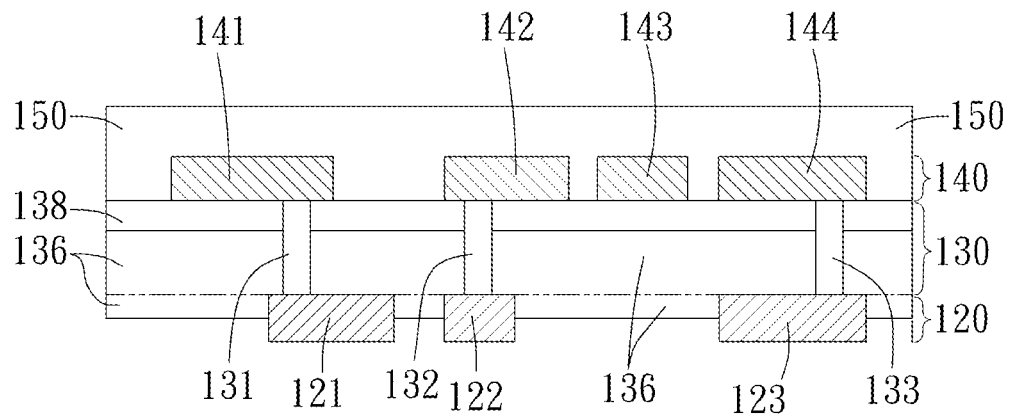
FIG. 3A schematically shows a cross-sectional view of a package substrate according to another embodiment of the present disclosure.

FIG. 3A schematically shows a cross-sectional view of a package substrate 200A according to another embodiment of the present disclosure. The package substrate 200A of FIG. 3A is similar to the package substrate 100 of FIG. 2 except the following discrepancy. The first dielectric material layer 126 and the molding compound layer 136 in FIG. 2 can be made of the same material, so the occupation area of the first dielectric material layer 126 and the molding compound layer 136 can be filled with of the same material at the same fabrication step to form the molding compound layer 136 in FIG. 3A.

Figure 3B:
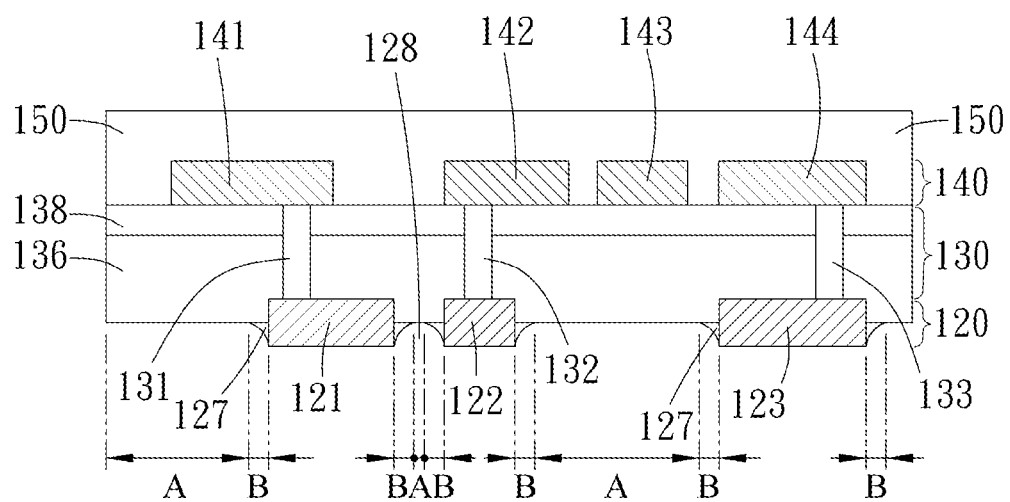
FIG. 3B schematically shows a cross-sectional view of a package substrate according to still another embodiment of the present disclosure.

FIG. 3B schematically shows a cross-sectional view of a package substrate 200B according to still another embodiment of the present disclosure. The package substrate 200B of FIG. 3B is similar to the package substrate 200A of FIG. 3A except the following discrepancy. The molding compound layer 136 has at least one protrusion part 127 at its lower part surrounding the first metal wires 121-123. The protrusion part 127 may extend from the molding compound layer 136 downwards, with a decreasing width from top to bottom. Preferably, the protrusion part 127 has a hyperbolic or parabolic concave side wall. Laterally, the side surfaces of the first metal wires 121-123 can be completely surrounded by the molding compound layer 136 having the protrusion parts 127. Vertically, however, the whole side surfaces of the first metal wires 121-123 can be covered by the molding compound layer 136, or the lower part of the side surfaces of the first metal wires 121-123 can be exposed and not covered by the molding compound layer 136 having the protrusion parts 127. Moreover, the projections formed by protruding the first metal wires 121-123 from the molding compound layer 136 can be used to prevent not-good soldering points which may be formed during the soldering process when a circuit chip is bonded to the first wiring layer 120.

Figure 4:
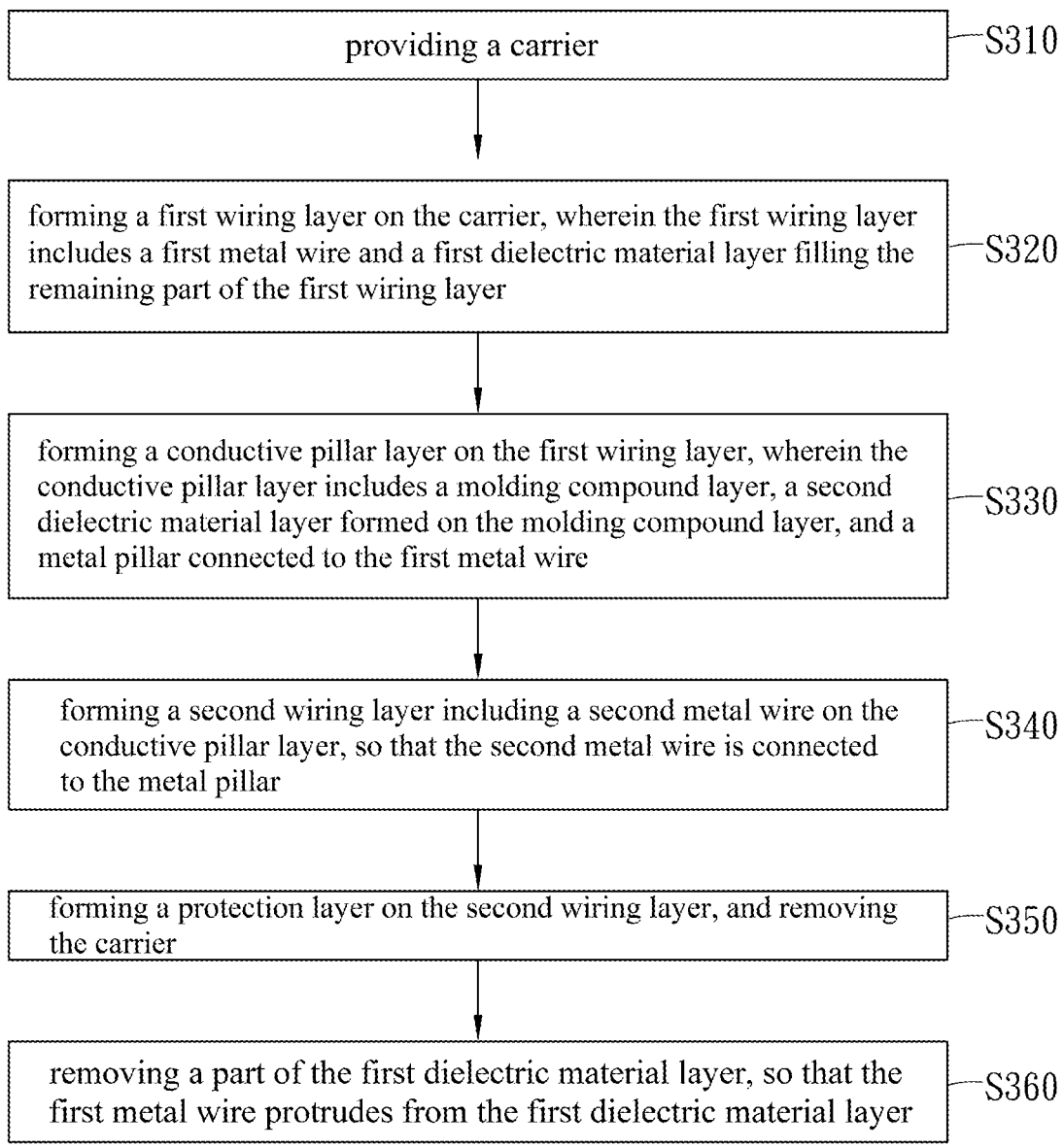
FIG. 4 shows a flowchart of a method for fabricating a package substrate.

FIG. 4 shows a flowchart of a method 300 for fabricating a package substrate, and FIG. 5A to 5E are cross-sectional views of the package substrate according to the embodiment of FIG. 2 or 3A in the present disclosure, corresponding to steps S310 to S360 in the fabrication process. The method 300 will be described in detail in the following paragraphs.

Figure 5A:
FIG. 5A to 5E are cross-sectional views of the package substrate according to the embodiment of FIG. 2 or 3A of the present disclosure, corresponding to different steps in the fabrication process.

At step S310, a carrier 110 is provided as shown in FIG. 5A to carry and support electronic components and conductive wires of the package substrate 100, e.g. the first wiring layer 120, the conductive pillar layer 130, the second wiring layer 140, and the protection layer 150 in FIGS. 2, 3A and 3B. The carrier 110 can be made of metal (such as Fe, Fe/Ni, Cu, and Al) or fiberglass in the embodiment.

Figure 5B:
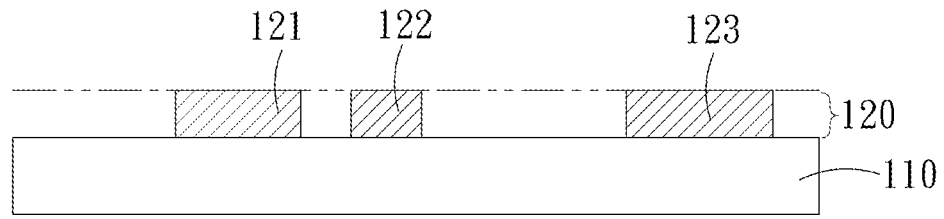

At step S320, a first wiring layer 120 is formed on the carrier 110 and then patterned to be a lower-layer part of the conductive wires of the package substrate 100, as shown in FIG. 5B. The first wiring layer 120 can be made of Cu, Al or Ni and formed by evaporating or electrolytic plating. The first wiring layer 120 can be patterned by the photolithography. For example, a first photoresist layer (not shown) can be deposited on the carrier 110 by laminating or spin-coating, and it would be patterned by exposure to light and developing. Then, a first metal layer (not shown) is deposited on the patterned first photoresist layer. By using the lift-off processing, the patterned first photoresist layer can be washed out together with the part of the first metal layer directly on its top surface, and the remainder of the first metal layer not on the patterned first photoresist layer stays on the carrier 110 to be the first metal wires 121-123 in the first wiring layer 120. Also, this step S320 can be realized by the Laser process. For example, a first metal layer (not shown) can be deposited on the carrier 110. The first metal layer can be partly removed by the Laser engraving so that the remainder staying on the carrier 110 becomes the first metal wires 121-123 in the first wiring layer 120.

Figure 5C:
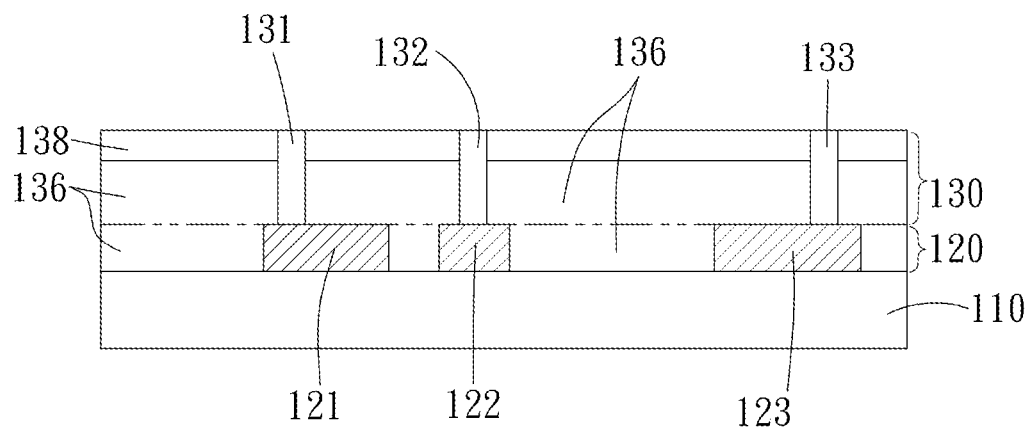

At step S330, a conductive pillar layer 130 is formed on the first wiring layer 120 and then patterned to be a plurality of metal pillars 131-133 as shown in FIG. 5C. The metal pillars 131-133 are used to electrically connect the first wiring layer 120 and the second wiring layer 140 to be processed in the subsequent fabrication steps. The metal pillars 131-133 can be made of Cu or Al and formed by evaporating or electrolytic plating. The conductive pillar layer 130 can be patterned by the photolithography. For example, a second photoresist layer (not shown) can be deposited on both the carrier 110 and the first wiring layer 120 by laminating dry film photoresist, and it would be patterned by exposure to light and developing. Then, a second metal layer (not shown) is deposited on the patterned second photoresist layer. By using the lift-off processing, the patterned second photoresist layer can be removed out together with the part of the second metal layer directly on its top surface, and the remainder of the second metal layer not on the patterned second photoresist layer stays on the first wiring layer 120 to be the metal pillars 131-133 in the conductive pillar layer 130.

Next, a molding compound layer 136 is formed on the carrier 110, and it covers all the top surface of the carrier 110 including all of the first metal wires 121-123 and the metal pillars 131-133. The molding compound layer 136 can be formed of insulating material suitable for molding (e.g. compression molding, transferring molding, and injection molding), such as epoxy-based-resin EMC. For example, a molding compound (not shown) is provided in a mold container (not shown). The mold container corresponds with the carrier 110 properly, so that the first metal wires 121-123 and the metal pillars 131-133 are all located between the mold container and the carrier 110. Then, a downward pressure is applied to the carrier 110 and an upward pressure is applied to the mold container. The pressures are maintained until the molding compound has cured to be the molding compound layer 136. The mold container can be removed after that. The upper part of the molding compound layer 136 can then be removed, so that the top surface of the molding compound layer 136 is lower than the top surface of the metal pillars 131-133. The molding compound can be made of insulating material suitable for compression molding, such as novolac-based resin, epoxy-based resin, and silicone-based resin; but is not limited thereto. In the embodiment, epoxy-based-resin EMC is used for the molding compound layer 136.

Next, a second dielectric material layer 138 can be formed on the molding compound layer 136, so that the top surface of the second dielectric material layer 138 is higher than the top surface of the metal pillars 131-133. For example, the second dielectric material layer 138 can be deposited by laminating or spin-coating, so that the second dielectric material layer 138 covers all of the molding compound layer 136 and the metal pillars 131-133. The second dielectric material layer 138 can be made of epoxy-based resin or polyimide. The second dielectric material layer 138 can be partly removed so that the top surface of the metal pillars 131-133 is exposed, as shown in FIG. 5C. The molding compound layer 136 and the second dielectric material layer 138 together cover all the first metal wires 121-123 and the metal pillars 131-133 on the carrier 110. They act as an insulation member between the first wiring layer 120 and the second wiring layer 140, and the metal pillars 131, 132 and 133 are used to connect the first metal wires 121, 122 and 123 with the second metal wires 141, 142 and 144, respectively. Thus, the upper part of the second dielectric material layer 138 has to be removed to expose top surfaces of the metal pillars 131-133. The removal can be realized by polishing, grinding, sandblasting, plasma or chemical etching. The second dielectric material layer 138 is polished to remove its upper part downwards until the exposure of the top surfaces of the metal pillars 131-133. The metal pillars 131-133, the molding compound layer 136 and the second dielectric material layer 138 are combined to be the conductive pillar layer 130.

Figure 5D:
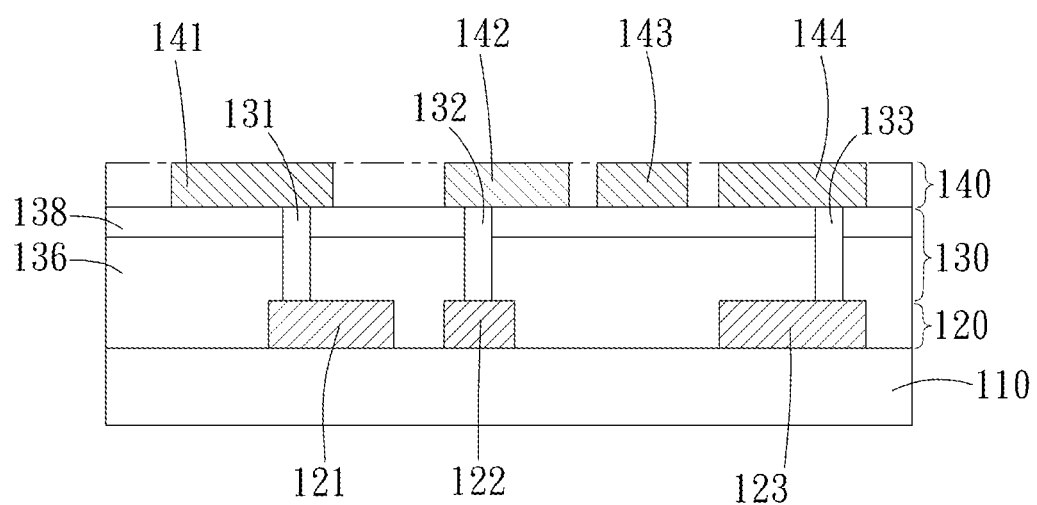

At step S340, a second wiring layer 140 is formed on the second dielectric material layer 138 and the exposed top surfaces of the metal pillars 131-133, and then patterned to be upper-layer conductive wires of the package substrate 100, including second metal wires 141-144 as shown in FIG. 5D. The second wiring layer 140 can be made of Cu, Al or Ni and formed by evaporating or electrolytic plating. The second wiring layer 140 can be patterned by the photolithography. For example, a third photoresist layer (not shown) can be deposited on the second dielectric material layer 138 by spin-coating, and it would be patterned by exposure to light and developing. Then, a third metal layer (not shown) is deposited on the patterned third photoresist layer. By using the lift-off processing, the patterned third photoresist layer can be washed out together with the part of the third metal layer directly on its top surface, and the remainder of the third metal layer not on the patterned third photoresist layer stays on the second dielectric material layer 138 to be the second metal wires 141-144 in the second wiring layer 140. The second metal wires 141, 142 and 144 are connected to the metal pillars 131, 132 and 133, respectively.

Figure 5E:
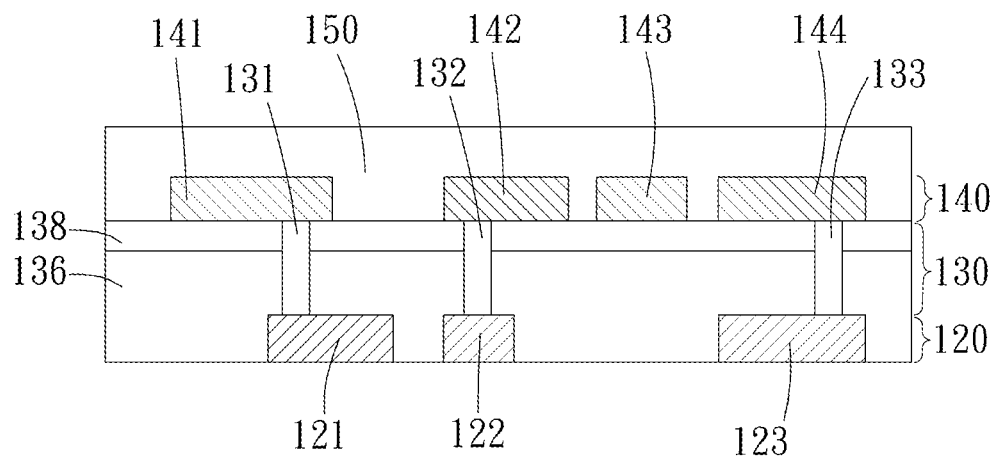

At step S350, a protection layer 150 is formed on the second wiring layer 140 and the second dielectric material layer 138. The protection layer 150 is used to electrically insulate the neighboring conductive wires in the second wiring layer 140 and to protect the second wiring layer 140 from being damaged by external objects or the subsequent fabrication process. Moreover, the package substrate 100 of the embodiment can be further processed to be a packaged integrated-circuit device. Before that, the carrier 110 can be removed, as shown in FIG. 5E.

At step S360, a part of the first dielectric material layer 126 can be removed as shown in FIG. 2, or a part of the molding compound layer 136 can be removed as shown in FIG. 3A, so that at least one of the first metal wires 121-123 can protrude from the first dielectric material layer 126. In one embodiment, when removing the carrier 110, we can also remove the lower part of the first dielectric material layer 126 (or the molding compound layer 136) or the part of the first dielectric material layer 126 (or the molding compound layer 136) adjacent to the carrier 110, as shown in FIGS. 2 and 3A. Assuming that originally the first wiring layer 120 has a constant thickness so that the first dielectric material layer 126 has a thickness equal to that of the first metal wire 121-123, we may then remove the lower part of the first dielectric material layer 126 to form the recesses as shown in FIG. 2. The projections, formed by protruding the first metal wires 121-123 from the first dielectric material layer 126, can be used to prevent not-good soldering points which may be formed during the soldering process when a circuit chip is bonded to the first wiring layer 120. One of the possible reasons comes from roughness and non-uniformity of the bottom surfaces of the first metal wires 121-123 when they are fabricated.

Referring FIGS. 3A and 3B, when removing the lower part of the molding compound layer 136 at step S360, we can have the remainder of the molding compound layer 136 contain first areas A and second areas B as shown in FIG. 3B. The first areas A have a bottom higher than the bottom surface of the first metal wires 121-123, and the second areas B surround the lower part of the first metal wires 121-123. The removal can be realized by polishing, grinding, sandblasting, plasma or chemical etching. The second areas B are longer that the first areas A, and the excess of the second areas B is used to surround the lower part of the first metal wires 121-123. The side surfaces of the first metal wires 121-123 are completely surrounded by the second areas B of the molding compound layer 136 having the protrusion parts 127. That is, the molding compound layer 136 has protrusion parts 127 at its lower part surrounding the first metal wires 121-123. The protrusion parts 127 may extend from the molding compound layer 136 downwards, with a decreasing width from top to bottom. Preferably, the protrusion part 127 has a hyperbolic or parabolic concave side wall. Laterally, the side surfaces of the first metal wires 121-123 can be completely surrounded by the molding compound layer 136 having the protrusion parts 127. Vertically, however, the whole side surfaces of the first metal wires 121-123 can be covered by the molding compound layer 136, or the lower part of the side surfaces of the first metal wires 121-123 can be exposed and not covered by the molding compound layer 136 having the protrusion parts 127. Moreover, the projections formed by protruding the first metal wires 121-123 from the molding compound layer 136 can be used to prevent not-good soldering points which may be formed during the soldering process when a circuit chip is bonded to the first wiring layer 120.

Alternatively, the so-called "backend processing" can be applied to the package substrate 100 of the above embodiments. For example, the lower part of the carrier 110 can be partly removed by using the photolithography to form an opening window (not shown) exposing the first wiring layer 120, so that an external electronic device (not shown) can be mounted in the opening window with electrical connection to the first metal wires 121-123.

Figure 6:
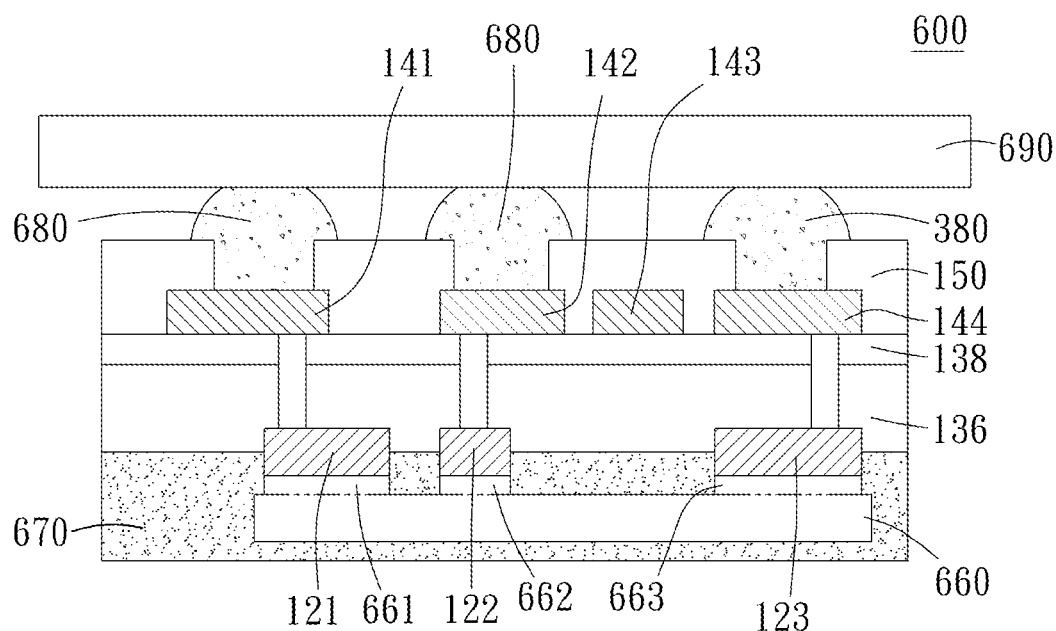
FIG. 6 schematically shows a cross-sectional view of a flip-chip package circuit according to one embodiment of the present disclosure.

The package substrate 200A in FIG. 3A can be further processed to fabricate a package circuit device. FIG. 6 schematically shows a cross-sectional view of a flip-chip package circuit 600 according to one embodiment of the present disclosure. The flip-chip package circuit 600 includes a package substrate, a circuit chip 660, and a printed circuit 690. The package substrate is basically the package substrate 200A in FIG. 3A. The circuit chip 660 is disposed under the package substrate 200A, and it has plural connection pins 661-663 electrically connected to the first metal wires 121-123, respectively. The circuit chip 660 is disposed on the first wiring layer 120 of the package substrate 200A in the flip-chip way, and a package material 670 is then used to package the circuit chip 660 and the lower part of the package substrate 200A together. Regarding the upper part of the package substrate 200A, the protection layer 150 can be properly patterned by the photolithography, so as to form openings for the electrical connection between the second wiring layer 140 and an external circuit. Thus, the printed circuit 690 can be bonded to the second metal wires 141, 142 and 144 through the openings of the protection layer 150 and the electrical connection members (e.g. the solder balls 680 as shown in FIG. 6) therein.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A method of fabricating a package substrate, comprising:
   (A) providing a carrier;
   (B) forming a first wiring layer on the carrier, wherein the first wiring layer includes a first metal wire with a first thickness and a first dielectric material layer with the first thickness, and the first metal wire is constructed with a photolithography process;
   (C) forming a conductive pillar layer on the first wiring layer, comprising a metal pillar, a molding compound layer, and a second dielectric material layer, wherein the metal pillar is constructed with the photolithography process and connected to the first metal wire, the molding compound layer and the second dielectric material layer are sequentially formed, the molding compound layer is placed above and covers the first wiring layer and the first dielectric material layer, the molding compound layer is also adjacent to the metal pillar and cover a lower portion of a side surface of the metal pillar, and the second dielectric material is placed above and covers the molding compound layer and the metal pillar, then the second dielectric material layer is partly removed for only covering an upper portion of the side surface of the metal pillar and for exposing a top surface of the metal pillars;

(D) forming a second wiring layer including a second metal wire on the conductive pillar layer, wherein the second metal wire is constructed with the photolithography process and is connected to the metal pillar;

(E) forming a protection layer on the second wiring layer to cover the second metal wire, and removing the carrier; and (F) removing a part of the first dielectric material layer for the first metal wire to protrude from the first dielectric material layer.

2. The method according to claim 1, wherein the first dielectric material layer is partly removed in step (F) to form a protrusion part having a decreasing width from top to bottom.

3. The method according to claim 1, wherein the first dielectric material layer is partly removed in step (F) to form a protrusion part having a concave side wall.

4. The method according to claim 1, wherein the first dielectric material layer is partly removed in step (F) to form a protrusion part having a side surface completely covered by the first dielectric material layer.

* * * * *